United States Patent [19]

Morton et al.

[11] 3,963,986

[45] June 15, 1976

[54] PROGRAMMABLE INTERFACE CONTACTOR STRUCTURE

[75] Inventors: Robert M. Morton, Hopewell Junction; Ariel L. Perlmann, Poughkeepsie, both of N.Y.

[73] Assignee: International Business Machines Corporation, Armonk, N.Y.

[22] Filed: Feb. 10, 1975

[21] Appl. No.: 548,659

[52] U.S. Cl. .......................... 324/158 F; 324/72.5; 324/158 P
[51] Int. Cl.² ..................... G01R 31/02; G01R 1/06
[58] Field of Search ......... 324/158 F, 158 P, 158 R, 324/72.5

[56] References Cited
UNITED STATES PATENTS 3,806,801 4/1974 Bove ................................ 324/158 F
3,866,119 2/1975 Ardezzone et al. ............. 324/158 F

*Primary Examiner*—R. V. Rolinec
*Assistant Examiner*—Ernest F. Karlsen
*Attorney, Agent, or Firm*—Wesley DeBruin

[57] ABSTRACT

A programmable interface contactor structure including a plurality of discrete electrical probes geometrically arranged, or oriented, to respectively electrically contact a discrete one of an array of conductive pads on a device under test. The plurality of discrete probes are contained and supported within a structure having a generally planar exposed upper surface where one end portion of each of said plurality of probes is electrically connected to a single conductive pad contained within an array of pads on said planar surface of the probe assembly. The contactor structure further includes a space transformer having a generally cylindrical overall configuration.

10 Claims, 7 Drawing Figures

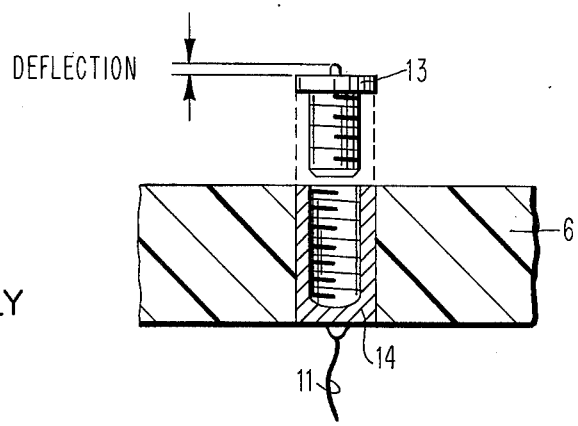
FIG. 3
POGO ASSEMBLY
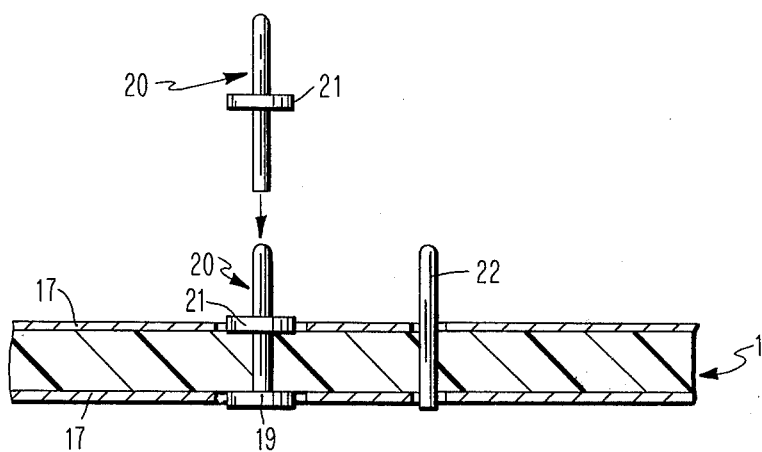
FIG. 4
PIN BOARD TARGET ASSEMBLY
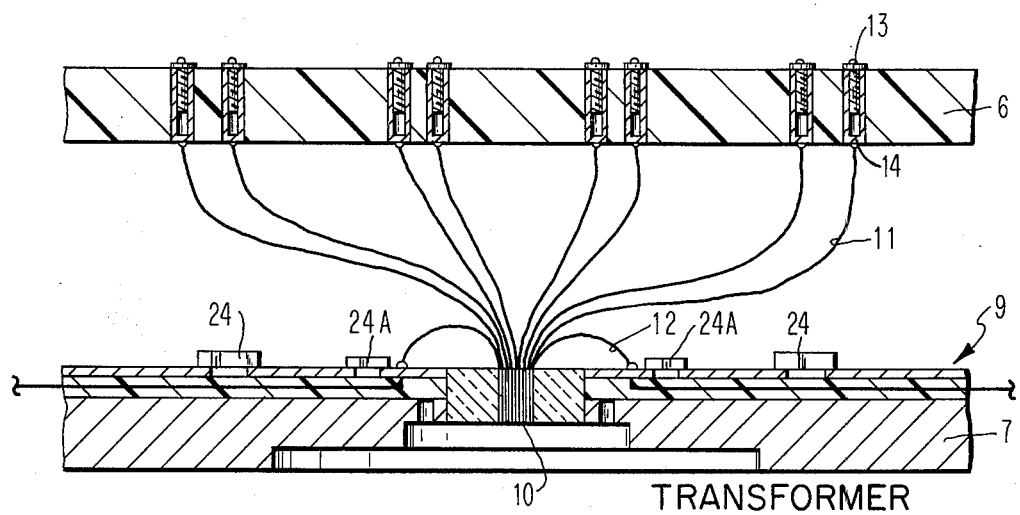
FIG. 5 TRANSFORMER I/O ASSEMBLY

PROGRAMMABLE INTERFACE CONTACTOR STRUCTURE

BACKGROUND OF THE INVENTION

In obtaining the electrical characteristics of components and packaging structures, such as integrated circuit devices and multilayer ceramic substrates, it is absolute requirement that the connection from the tester to the device or structure under test, have a controlled electrical environment so as not to distort the test signals and test results. This is especially important and demanding in light of the ever increasing circuit speeds and density of the devices under test.

Also increasing, in addition to the circuit speeds of the integrated circuits are the number and density of the interconnection pads on the integrated circuit device and the packaging substrate. Namely, the density of the circuitry on a monolithic device is increasing as the art advances. This increase in circuit density in an integrated circuit, in many, if not all instances, dictates a greater number and density of the connection pads on an integrated circuit. Correspondingly, the number and density of connection pads on packaging substrates must be increased to accommodate the increase in number and density of connection pads of the high circuit density integrated circuit devices. Further, as the circuit density and speed of the integrated circuit increases the conductive paths within the packaging substrate increase in number and density and their length must be reduced or at least not increased. Also, the number and density of the conductive pads on a packaging substrate increase as the number and density of the conductive paths therein increase. These factors oppose from a practical, or fabrication point of view, the ability of a contacting system to achieve a minimum acceptable distortion free environment. These factors, as the art progresses, render the testing of integrated circuit devices, and interconnecting packaging structures more difficult. As the art progresses, the testing problems requiring solution are many and complex. Included in these test problems are electrical environment, namely the electrical contacting of a densely spaced array of pads with each electrical connection having substantially equal and minimum uniform impedance characteristics. In testing, the electrical connections to the pads must be made rapidly and precisely, must not place undue stress on the pads, must not mechanically damage the pads, and the input signals to, and output signals from the device under test must not be subjected to distortion or delay.

A major portion of the electrical path from the tester to the device under test and return is used for the space transformation function. Its purpose is to take a large multiplicity of electrical conductors from the tester which are spaciously arrayed and transform them into a highly dense array, similar to, or identical to, the densely spaced device under test input/output pad pattern or array. Since the conducting path length from the tester to the device under test is dominated by the space transformer, for electrical testing to be done successfully, a constant impedance environment is necessitated. Reference is made to the publication "AC Space Transformer for Multipin Systems", by A. Perlmann et al, in the IBM Technical Disclosure Bulletin, Volume 16, No. 8, January 1974, pages and 2725. In this publication the space transformer disclosed and depicted provides electrical continuity under AC environment between contacts that are positioned on close centerline spaces to a larger array, which enables conventional contact mechanisms to be used. The structures essentially comprises top and bottom plates respectively having the proper array of apertures for accommodating coaxial cables. The coaxial cables each have an outside diameter which gradually decreases toward the lower end housed in the apertures of the bottom plate. A spaciously spaced array of contacts on said upper plate is transformed in space to a densely spaced array of contacts on said lower plate. Each coaxial cable providing a path of substantially constant electrical impedance from a contact on said upper plate to a contact on said lower plate.

Reference is made to the publication "Space Transformer for Use in an Electronic Test System" by R. Bove et al, in the IBM Technical Disclosure Bulletin, Volume 17, No. 3, August 1974, pages 930 and 931. In the publication the space transformer disclosed and depicted employs a plurality of multilayered printed circuit boards. Each board is fabricated to have a single line pattern plane, dielectric planes and a ground plane. The boards are sandwiched together to provide stripline transmission characteristics, whereby essentially constant electrical impedance is obtained. Additionally, at the center of the spaces transformer, where the signal lines converge, discrete conductive members are respectively connected to each signal line. These conductive members are respectively oriented perpendicular to the signal lines and connected to a planar array of conductive pads on the lower planar surface of the space transformer. The space transformer of the Bove et al publication provides structure for the electrical connection of a large number of discrete conducting paths originating at a tester to the highly dense array of electrical pads of a probe assembly.

Reference is made to U.S. Pat. No. 3,493,858 granted Feb. 3, 1970, for "Inflatable Probe Apparatus for Uniformly Contacting and Testing Microcircuits" to D. G. Baron et al and of common assignee herewith.

U.S. Pat. No. 3,493,858 is directed to an inflatable probe apparatus wherein a flexible bag stretched over a frame has a series of conductors mounted on the frame. The bag is positioned whereby a portion thereof is disposed paralled to the surface of an element which contains one or more microcircuits, the conductors being arranged with projecting probe points extending from the plane of the bag adjacent to the substrate in a pattern coinciding with the pattern of the terminal areas of the circuit on the element. The bag is adapted to be inflated to move the extending probe points into contact with the corresponding terminal areas of the circuitry.

Reference is made to the U.S. Pat. application, Ser. No. 537,514, by Ronald Bove et al, filed Dec. 30, 1974, entitled "High Density Wafer Contacting and System," and of common assignee herewith.

Application Ser. No. 537,514, is directed to a contactor structure employed in a high speed electronic test system for testing the electrical integrity of the conductive paths (or lines) in the packaging substrate prior to the mounting and connection thereto of the high circuit density monolithic devices. The contactor structure includes a plurality of discrete electrical probes geometrically arranged, or oriented to respectively electrically contact a discrete one of said array of conductive pads on said packaging substrate or said semiconductor device. The contactor structure further includes a semiconductor space transformer fabricated by large scale integration techniques and containing a plurality of discrete first integrated circuits. The first integrated circuits of the space transformer being respectively electrically connected to said electrical probes. Second integrated circuitry interconnecting said first integrated circuits is also contained within said semiconductor space transformer. Under control of said test system said second integrated circuitry selectively energizes selected first and second ones of said first integrated circuits. Each of said first integrated circuits contains circuitry, whereby said selected first and second ones of said first circuits will manifest the electrical integrity of the electrical path therebetween. Namely, the electrical path whose integrity is manifested is the conductive path in the device or substrate under test. The conductive path, or circuit, under test, is the path, or circuit, extending between the pad on said substrate in electrical contact with the probe connected to said selected first one of said first integrated circuits, and the pad on said substrate in electrical contact with the probe connected to said selected second one of said first integrated circuits.

Reference is made to U.S. Pat. No. 3,911,361, granted Oct. 7, 1975 to Ronald Bove et al entitled "Coaxial Array Space Transformer", and of common assignee herewith.

U.S. Pat. No. 3,911,361 is directed to circuit means for connecting a high speed electronic tester to a high circuit density monolithic device under test and where said circuit means includes a unitary structural combination of a space transformer and a probe structure, said space transformer and said probe structure being mechanically and electrically mated to provide a plurality of discrete physical electrical contacts with said device under test, said space transformer including: a printed circuit board having a plurality of discrete electrically conductive contact areas and at least one relatively large contact area; a densely spaced array of discrete electrical contacts; said densely array of discrete electrical contacts being supported by and maintained in space relationship one to another by a material having predetermined dielectric characteristics; a plurality of coaxial cables; each of said coaxial cables having an inner conductor, an outer ground shield and dielectric material maintaining said inner conductor and said outer ground shield in space relationship; each of said inner conductors of said plurality of coaxial cables being connected between a predetermined one of said plurality of discrete electrically conductive contact areas on said printed circuit board and a predetermined one of said densely spaced array of electrical contacts; a plurality of metallic plates for supporting said plurality of coaxial cables in spaced relationship, connection means for electrically connecting in common each of said plurality of metallic plates, each of said outer ground shields of said plurality of coaxial cables, and said relatively large contact area on said printed circuit board; said probe structure having a plurality of electrically discrete buckling beam probes; each of said buckling beam probes making physical and electrical contact with a predetermined one of said densely spaced array of discrete electrical contacts; each of said buckling beam probes having a length many times its cross-sectional area whereby the probes buckle when an axial load is applied thereto.

Reference is made to U.S. Pat. No. 3,731,191 granted May 1, 1973, for a "Micro-Miniature Probe Assembly" to Robert L. Bullard et al and of common assignee herewith. U.S. Pat. No. 3,731,191 is directed to a multi-probe circuit assembly for providing low resistance electrical connections to a semiconductor component of which the electrical parameters are to be provided.

In accordance with the invention disclosed and claimed in U.S. Pat. No. 3,731,191 a contact apparatus is provided in which a plurality of probe elements are fixedly held by a common support housing in a fixed array corresponding with the terminal contact pattern of the circuit device to be engaged for testing. Essentially, the probe elements comprise individual tubular probe guides with individual probe wires, or the like, removably contained and compressible within the probe guides. Fixation of the probe elements in the desired array is provided by an encapsulation housing including a support plate portion of the support housing having a plurality of openings arranged to correspond with the test contact pattern of the circuit device. One end of each of the tubular probe guides is attached to the support plate within the plate openings while the other end is held within the housing preferably adjacent and in abutment with a pressure plate opposite the remote ends of the probe guides. The probe wires are designed such that when fully inserted within the probe guide, they extend a controlled amount beyond the end of the housing support plate while the remote ends of the probe wires abut the pressure plate. The tubular probe guides are high conductivity material while the probe wires are conductive material having high resistance to abrasive wearing. Electrical circuit continuity is made by surface contact of the probe wires within the probe guides which are in turn connected to external connector boards or the like mounted on the housing and having provision for connection to external test circuits or the like.

In U.S. Pat. No. 3,731,191, the probe guides are preferably curved between their ends within the housing. Thus, when contact is made with a test terminal, the probe wires have a spring-like quality and are compressible within the probe guides, the curvature and spring-like qualities of the probe wires causing electrical contact to occur very close to the contact end of the probe guide. Thus, only a short length of relatively high resistance probe wire is in the electrical circuit while the high conductivity probe guide acts as the principal electrical connection with the external circuits. Since the probe guides and probe wires are conductive, the contact apparatus is essentially made of dielectric material, particularly the support plate and the pressure plates. In addition, the probe guides are completely encapsulated within a dielectric material so that the probe elements are mutually electrically insulated as well as being held rigidly in position.

Reference is made to U.S. Pat. No. 3,806,801, granted Apr. 23, 1974, to Ronald Bove, directed to "Probe Contactor Having Buckling Beam Probes," and of common assignee herewith. U.S. Pat. No. 3,806,801, discloses a probe contactor in which each of the probes will exert a substantially constant force on each of the pads on the chip irrespective of the relative height of the pads on the chip as long as the pads on the chip have their height within the predetermined range in which the probes can engage the pads. This is accomplished by forming each of the probes with a length many times its cross sectional area so that each of the probes may be deemed to be a beam. Each of the probes is designed so that it will deflect over a range when a predetermined force is applied at its end engaging the pad to axially load the probe so as to prevent additional forces, beyond the predetermined force, being applied to the pad due to engagement of the pad with the probe.

Reference is made to U.S. Pat. No. 3,806,800 granted Apr. 23, 1974, to R. Bove et al, directed to "Method and Apparatus for Determining the Location of electrically Conductive Members on a Structure", and of common assignee herewith. In U.S. Pat. No. 3,806,800, the electrically conductive pads on a semiconductor chip or the engineering change pads on a multilayer substrate are located electronically relative to probes which are in a predetermined orthogonal orientation, so that the particular probe or probes in engagement with each of the pads is determined. Then, the electrical characteristics of any electrical unit connected to each of the pads is ascertained through selectively controlling the electrical power supplied through the probes to the pads in a controlled manner.

U.S. Pat. No. 3,835,381 granted Sept. 10, 1974, to O. R. Garretson et al., entitled "Probe Card Including A Multiplicity of Probe Contacts and Methods of Making," discloses a probe card useful in testing the effectiveness and utility of semiconductor devices and hybrid circuit substrates prior to the application to such devices and substrates of terminal leads for interconnection with other components. The probe card includes a unitary electrically conductive probe assembly including a multiplicity of closely spaced conductive probes arranged in a radiating array to provide a multiplicity of contact tips adapted to be pressed with uniform pressure and contact resistance on the terminal pads of semiconductor devices and hybrid circuit substances.

SUMMARY OF THE INVENTION

The integrity of densely spaced circuitry contained on, and within, a semiconductor device fabricated by large scale integration techniques is determined by electrically exercising the circuitry of the semiconductor devices. The electrical exercising of the semiconductor device under test takes place in a high speed electronic test system wherein said device under test has applied thereto appropriate inputs and power supply conditions, and provides outputs in response thereto. The outputs from the device under test are received by the test system and compared with known acceptable outputs. Numerous high speed electronic test systems generally of the type briefly and generally described above are known and employed in the art.

Most, if not all, test systems known and employed in the art require a plurality of discrete electrical connections between the device under test and the test system. These connections must be rapidly and accurately made. These connections must not damage the device under test. These connections must provide an electrical environment between the test system and the device under test that does introduce extraneous and spurious signals. These connections must possess such electrical and mechanical conditions as to efficiently, and with high fidelity transmit precisely shaped pulse of short time duration to and from the device under test. As briefly discussed earlier herein the art has addressed these requirements with various structures. The prior art structures are severely challenged to provide satisfactory performance as the density of the circuitry of devices under test increases, the speed of the circuitry of the devices under test increases, and the part numbers of the devices under test increases.

The invention is particularly directed to a novel Programmable Interface Contactor structure which clearly meets and surpasses all the afore-recited requirements and the challenge of increased circuit density, circuit speed and part number increase.

The Programmable Interface Contactor structure comprises a unitary structure for efficiently, rapidly, and in controlled electrical environment, providing the plurality of discrete electrical contacts between the electronic test system and the device under test. The Programmable Interface Contactor Structure comprises a unitary structure including three electrically and mechanically mated and precisely aligned portions, namely, a part number printed circuit board, a space transformer, and a probe assembly. The orientation of the probes of the probe assembly is identical to the orientation of the conductive pads on the substrate to be tested. The space transformer interconnects the probe assembly with the part number printed circuit board and includes means for providing power supply potentials, via selected probes of the probe assembly, to the device under test. The part number printed circuit (P/N) board provides for rapid efficient electrical interconnection of the space transformer to the tester. The P/N board facilitates the testing of a plurality of groups of semiconductor devices in succession where each group is a different part number; where the conductive pad array of each semiconductor of each group is identical, though the function of the pads except for the power pads may vary group to group. Each of the above features and advantages of the Programmable Interface Contactor Structure will be fully apparent from the detailed description of the preferred embodiment of the invention set-forth hereinafter.

Further, as will also be fully apparent to persons skilled in the art from the description that follows the practice of the invention is not limited to the electrical testing of active semiconductor devices. The invention is clearly applicable to A.C. and D.C. testing of active and passive devices and structures, such as semiconductor devices fabricated by large scale integration techniques, and semiconductor multilayered ceramic, printed circuit board substrates with electrically conductive paths (lines) incorporated therein. (Namely, packaging substrates with electrical conductive paths or lines incorporated therein and utilized as substrates on which semiconductor chips are mounted).

It is a primary object of the invention to provide a Programmable Interface Contactor Structure.

It is a primary object of the invention to provide a Programmable Interface Contactor Structure for use in a high speed electronic test system wherein the merit, or lack or merit, of electronic devices, and structures employed therewith is determined.

It is a primary object of the invention to provide an improved device under test Programmable Interface Contactor Structure for use in a high speed electronic test system.

It is a primary object of the invention to provide an improved device under test Programmable Interface Contactor Structure for providing in a high speed electronic test system rapid, accurate, under a controlled electrical environment, electrical connections between the test system and the device under test, whereby efficiently and with high fidelity electrical energy is provided to said device under test and said device and said test system are efficiently electrically coupled one to the other to facilitate high speed electrical communication therebetween.

It is a primary object of the invention to provide an improved device under test Programmable Interface Contactor Structure for providing in a high speed electronic test system rapid, accurate electrical connection, in a controlled electrical environment, without damage to the device under test, between a device under test and a test system, whereby with efficiency and high precisely shaped pulses of short time duration at a high repetition rate are transmitted from the test system to the device under test, and from the device under test to the test system.

It is a primary object of the invention to provide an improved device under test Programmable Interface Contactor Structure specifically including structure for providing in an electrically efficient environment power supply potentials to a device under test.

It is a primary object of the invention to provide an improved device under test Programmable Interface Contactor Structure specifically including a printed circuit part number board for rapidly and efficiently changing the connections between the test system and the device under test whereby semiconductor devices having like arrays of conductive pads but varying in circuitry may quickly and efficiently be tested.

It is a primary object of the invention to provide in a high speed test system an improved device under test Programmable Interface Contactor Structure specifically including means for rapidly changing from testing a first semiconductor device having a first part number, to a second semiconductor device having a second part number.

It is an object of the invention to provide a device under test Programmable Interface Contactor Structure which reduces wiring complexity and hardware when employed in an electronic test system.

It is an object of the invention to provide in a test system a device under test contacting structure which reduces test time.

It is an object of the invention to provide in a test system a device under test contacting structure where all products having the same grid pattern of test points may be tested by said test system.

The foregoing and other objects, features and advantages of the invention will be more apparent from the following more particular description of the preferred embodiment of the invention, as illustrated in the accompanying drawings.

BRIEF DESCRIPTION OF THE DRAWINGS

FIG. 3 discloses a sectional view of a portion of upper plate 6 of the space transformer structure 2 of the Programmable Interface Contactor Structure of FIGS. 1 and 2. The portion of plate 6 depicted in FIG. 3 includes the showing of a representative pogo connector 13, 14 and how it is seated in plate 6.

FIG. 4 discloses a sectional view of a portion of the part number printed circuit board 1 of the Programmable Interface Contactor Structure of FIGS. 1 and 2. FIG. 4 further shows a pin having collar 21.

FIG. 5 discloses a sectional view of a portion of the space transformer structure 2 of the Programmable Interface Contactor Structure of FIGS. 1 and 2.

DESCRIPTION OF THE PREFERRED EMBODIMENT

Figure 1:
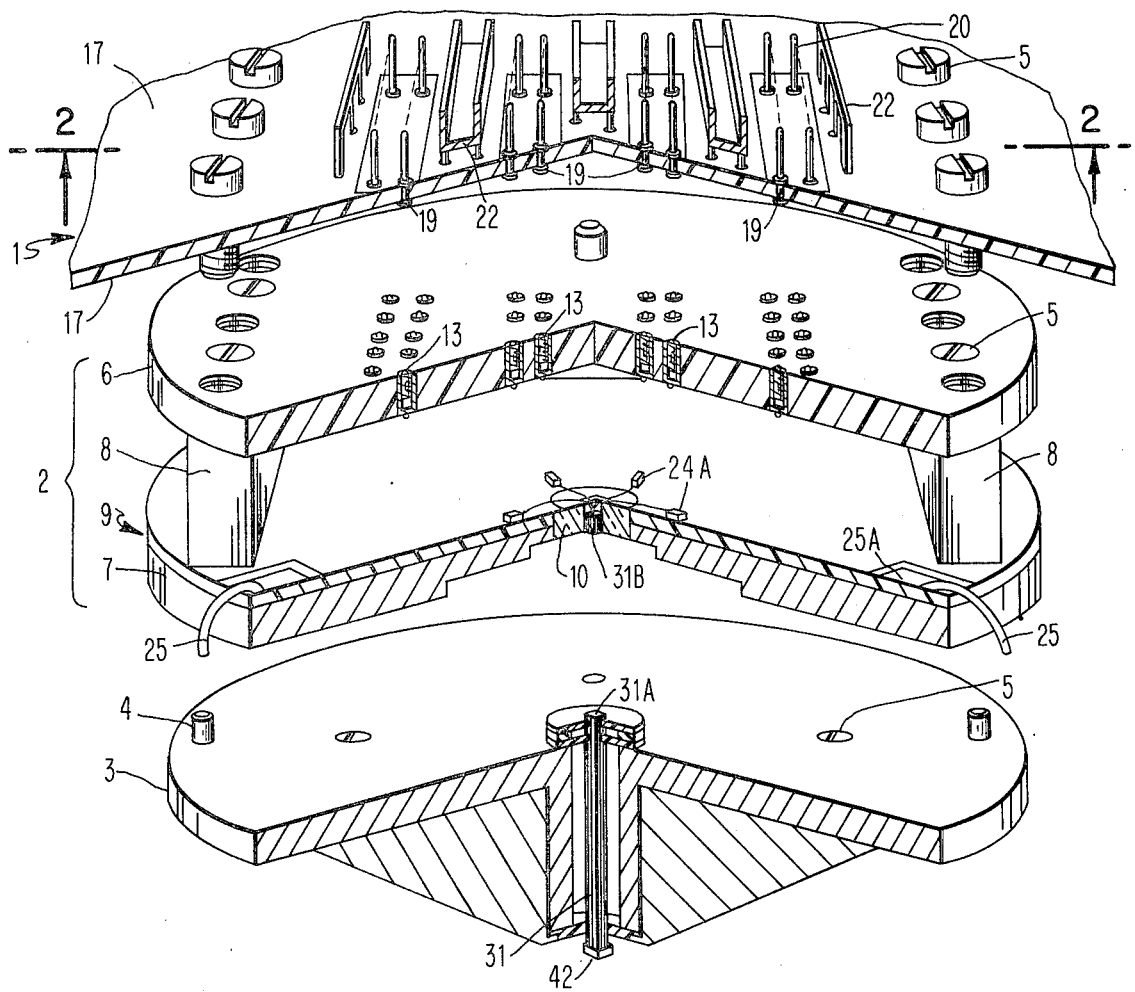
FIG. 1 discloses, partially in section, and in exploded perspective, the Programmable Interface Contactor structure in accordance with the preferred embodiment of the invention.

Reference is made to the drawing and in particular, FIG. 1. The Programmable Interface Contactor Structure shown, partially in section, and in exploded perspective in FIG. 1 comprises three main subassemblies: part number printed circuit board 1; cylindrical space transformer structure 2, including the essentially inverted pyramidal shaped space transformer and the printed circuit power board 9; and the probe assembly 3. The three subassemblies are mechanically and electrically mated into one unitary structure. Each subassembly is aligned and fastened to its adjacent subassembly by any suitable means such as dowel pins 4 and machine screws 5.

The probe assembly 3 includes an array of probes 31, oriented in an array, which corresponds to orientation of the conductive pads (or test points) on the upper planar surface, as viewed in FIG. 1, of the product under test 42. The probe assembly 3 may be generally of the type disclosed and claimed in the afore identified and discussed Bove U.S. Pat. No. 3,806,801. As more fully described and illustrated in the Bove patent each of the probes 31 is formed with a length many times its cross sectional area so that the probes buckle or deflect when a predetermined axial load is applied thereto. This enables the same force to be exerted on each of a plurality of pads on a semiconductor chip, wafer, device, or product under test, regardless of the deflection of the probes produced by variations in the heights of the pads. Each of the probes 31 is supported and contained within the probe assembly 3 in electrical isolation from each other and from probe assembly housing structure 3. Each of the probes 31 terminates in a discrete conductive pad contained within an array of discrete conductive pads 31A supported upon a surface of suitable dielectric material. The array of discrete conductive pads 31B supported on a planar surface of space transformer die 10 are spaced and arranged to correspond to the array 31A of the probe assembly.

When the Programmable Interface Contactor Structure is assembled, an electrical interface between the space transformer and probe assembly is formed by the array of conductive pads 31A and 31B. The structure and method of interfacing the space transformer structure 2 and the probe assembly 3 is preferably identical or substantially the method and structure of accomplishing the interface set forth in the afore identified and discussed Bove et al U.S. Pat. No. 3,911,361.

Figure 2:
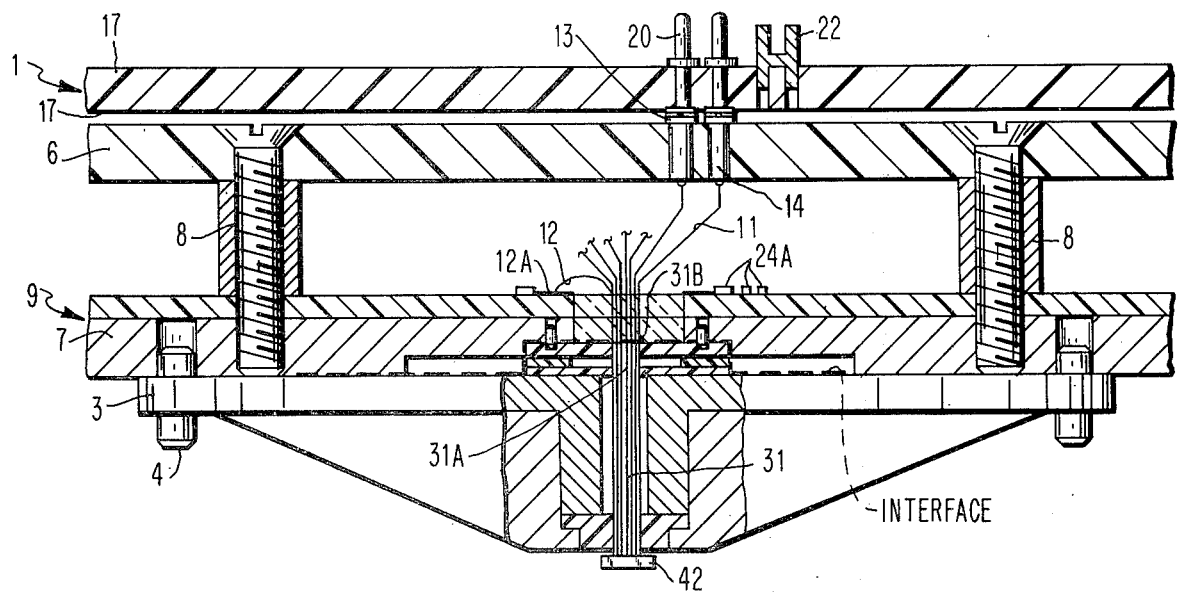
FIG. 2 discloses a sectional view taken along the lines 2—2 of FIG. 1 of the Programmable Interface Contactor structure in accordance with the preferred embodiment of the invention.

The space transformer structure 2 as explained above electrically interfaces with the probe assembly via the array of conductive pads 31B and 31A. Referring to FIGS. 1, 2, and 4, it will be seen that the lower surface of the part number circuit board 1 contains an array of conductive area or surfaces 19. Each of the surfaces 19 is formed integrally with a conductive pin 20 extending from the upper surface of part number printed circuit board 1. Referring to FIGS. 1, 2 and 3, the planar surface of plate 6 contains a plurality pogo contacts 13 extending therefrom. These contacts 13 are electrically isolated one from another and arranged in a pattern corresponding the pattern of array of conductive areas 19 on the lower planar surface of the printed circuit power board 1. Thus it is seen that an electrical interface between the part number printed circuit board 1 and the space transformer structure 2 is formed by contacts 13 and conductive areas 19 when the Programmable Interface Contactor Structure is in an assembled and operative state. The space transformer structure includes an upper plate 6, and a lower plate 7 with stand-offs or spacers 8 for maintaining said plates in spaced parallel relationship and alignment. The plate 6 is preferably formed of electrically non-conductive material, such as epoxy-glass, or phenolic which has suitable dielectric properties. The plate 7 is formed of metal, such as aluminum or steel. As seen in FIGS. 1 and 2 the printed circuit power board 9 is supported by the upper (inner) surface of metal plate 7. Centrally positioned and carried by plate 7 is the space transformer die 10. This die comprised of dielectric material has one end of each of the plurality of conductors 11 and 12 embodied therein and maintained in precise spaced relationship to one another therein. The conductors 11 and 12 respectively complete an electrical path from a connection within the space transformer to a predetermined one of the conductive pads of the array of conductive pads 31B of the space transformer. As will be more fully explained hereinafter, in the preferred embodiment conductors 11 are respectively portions of the electrical paths for conveying Input and Output signals to and from the device under test. Whereas conductors 12 are respectively portions of the electrical paths employed for impressing power supply potentials and/or currents on the device under test.

The space transformer conductors 11 and 12 may be considered as two groups of insulated highly conductive wire. The I/O group of lines 11 are preferably fabricated from insulated beryllium-copper wire. The power group of lines 12 are preferably fabricated from insulated beryllium-copper wire.

Referring to FIGS. 1, 2 and 3 the I/O lines respectively terminate at the pogo connectors 13, 14 of the upper plate 6 of the space transformer structure 2. Namely each insulated I/O conductor 11 completes an electrical path from a pogo connector 13, 14 to a predetermined one of the conductive pads 31B. As seen in FIG. 3, the conductors 11 are soldered to the housing portion 14 of the pogo connector 13, 14.

Referring to FIGS. 1, 2 and 5 the power lines respectively terminate at conductive lands or pads inwardly position on the surface of power board 9. Namely each insulated power conductor 12 completes an electrical path from a conductive land on the printed circuit power board 9 to a predetermined one of the conductive pads 31B. The power conductors 12 are soldered to the conductive lands. The printed circuit power board 9 is described in detail hereinafter.

As stated above the I/O lines terminate at the upper plate 6 of the space transformer structure 2 where they are respectively soldered to the pogo connectors 13, 14. The pogo connectors are mounted in the plate 6 as shown in FIGS. 1 and 2 and in detailed cross section in FIG. 3. Each of the pogo connectors comprises a replaceable plunger 13 which is threaded into the sleeve 14. Each plunger 13 is adapted to deflect as much as 0.040 inches. As stated earlier the pogo connectors are utilized to provide an electrical interface between the part number printed circuit board 1 and the space transformer structure 2. Namely the exposed pogo contact surfaces 13 are displaced in an array so as to match, or correspond to the array of target areas 19 on the lower planar surface of the part number printed circuit board 1. The part number printed circuit board is fabricated from any suitable material, numerous of which are known to the art, such as epoxy glass. As seen in FIGS. 1 and 2 and in detail from FIG. 4 there is a copper surface on each side of the board. The structural materials and fabrication of printed circuit boards is a highly developed art and no detail discussion thereof is deemed necessary to a complete understanding of the invention. Although in the preferred embodiment the part number printed circuit board is depicted as not including an inner conductive printed circuit plane it will be appreciated multilayer printed circuit boards may be employed in the practice of the invention.

Referring to FIG. 4, it will be seen that the target areas 19 are the ground-down and plated surfaces of pins 20 after being respectively pressed into the openings of an appropriate array of openings in the part number printed circuit board 1. The method of fastening the pin to the board is by inserting a pin 20 with an appropriately positioned collar 21. The exposed lower portion of the pin is swaged to provide a relatively enlarged conductive area. This area is ground to provide a planar surface and then plated with gold to serve as a low resistance conductive area or surface 19 on the lower surface of the printed circuit power board 1.

The part number printed circuit board is connected to the test system, or tester of the test system, by what is known in the art as a "make and pin" configuration. The structure of the connectors for connecting the pins 20 to the lines from the test system and the rakes 22 to ground are well known in the art. For example with suitable connectors the lines from the test system to the pins and rakes of part number printed circuit board 1 may be tri-leads and/or coaxial cables. It will be appreciated that the part number printed circuit board 1 of the preferred embodiment may be modified to include passive or active components slidably connected to selected pins 20 and rakes 22 to facilitate testing a particular product part number under test. Namely the test system user chooses and selects the appropriate components for the part number under test and appropriately positions and connects these component on the upper surface of the part number circuit board 1. It will be seen that components, active or passive, positioned on the upper surface of the part number board are positioned relatively close, in the order of 2 inches, from the device under test. As will be appreciated by persons skilled in the art this is a material and significant consideration in maintaining the quality of the electrical environment of I/O paths between the tester and the device under test.

The copper surfaces 17 of the part number board 1 are etched prior to the fabrication thereon of the pins 20 and rakes 22. The pattern etched will provide proper land connections for any components to be mounted thereon.

There are two ground systems. One maybe termed the "product under test ground" which is included in the power lines emanating from the device under test. In the "product under test ground" certain probes of the probe assembly and paths on the power board 9 are employed. The second ground system is the "tester ground". The probe assembly housing 3, the lower copper surface of the power board 9, the stand-offs 8 and copper surfaces (upper and lower) of the part number board are commonly connected and constitute the "tester ground". A plurality of conductors 22A (for example eight in number) suitably disposed within the space transformer structure 2 (see FIG. 2) are connected between plate 7 and the lower copper surface 17 of part number board 1. These ground wires are preferably radially disclosed in a configuration following closely the paths of the I/O lines 11 extending from the space transformer die 10 to the pogo connectors 13, 14. These ground paths reduce the inherent inductance which exists in every ground line.

The power board 9 efficiently accomplishes the function of providing power to the device under test. The testing of relatively high power, high frequency, semiconductor devices fabricated by large scale integration techniques and having high circuit density dictates that the connections to the power supply have minimum, or very low, impedance. To accomplish this low impedance path the powering lines 12 emanating from the space transformer die 10 are relatively short in length and are respectively terminated on relatively large area printed circuit lands 12A on the power board 9. The plurality of lands, one for each power lead 12, are each heavily decoupled with a capacitor 24 and a capacitor 24A. Capacitor 24A may be termed a chip capacitor since it is physically small and thus many can be used close to the center of the power board 9, and it has low inductance at high frequencies. Capacitor 24 is preferably a small tantalum capacitor. It is physically larger in size and capacitance than the chip capacitor. It can be used in the greater areas of the board away from the center. It is needed for low frequency decoupling. The heavy decoupling accomplished by capacitors 24 and 24A further minimizes or reduces the impedance of the power supply paths to the device under test. The power board accomplishes the efficient positioning and connection of the decoupling capacitors at a minimum physical and electrical distance from the device under test. Around the periphery of the power supply board relatively sizeable conductive lands 25A (FIG. 1) are provided for connection thereto of the power supply lines 25 from the test system. Thus the power board provides: lower impedance power supply paths to the device under test; convenient and close spacing to the device under test of the decoupling capacitors in the power supply paths; and efficient connection via lands 25A, removed from the I/O lines 11, of the power supply lines 25 from the tester. It is to be noted that the capacitors 24 and 24A and the connection of the power supply leads 25 is displaced in space with respect to the delicate center assembly of the space transformer, together with a reduction of the impedance of the power supply paths.

Further, it will be appreciated that additional active or passive components, such as current measuring resistors and/or relays may, as required be suitably mounted on the power supply board without detriment to the low impedance of the power supply paths to the device under test.

In particular the power probes of probes 31 must be protected from excessive currents. In the preferred embodiment each powering probe 31 is separately monitored. Assuming there are 24 powering probes, 31, required in the probe assembly, then 24 lands 12A and capacitors 24A must be provided closely spaced from the periphery of the space transformer die 10. Also 24 lands 25A and capacitors 24 must be provided.

Namely each power supply path includes a land 12A and a chip capacitor 24A closely spaced to the space transformer die 10. These lands 12A, each have connected thereto a power lead 12. The power leads 25 from the tester are each connected to a sizeable land 25A. Each land 25A is connected to discrete first and second decoupling capacitors 24 and 24A. Where 24 power leads 12, together with 24 power probes are employed, the power board is preferably a multilayer printed circuit board where integral planes and conductive vias there between are employed. Thus the powering paths to each of the leads 12 is provided with fully sufficient current carrying capacity, adequately decoupled, and is of low impedance.

Figure 6:
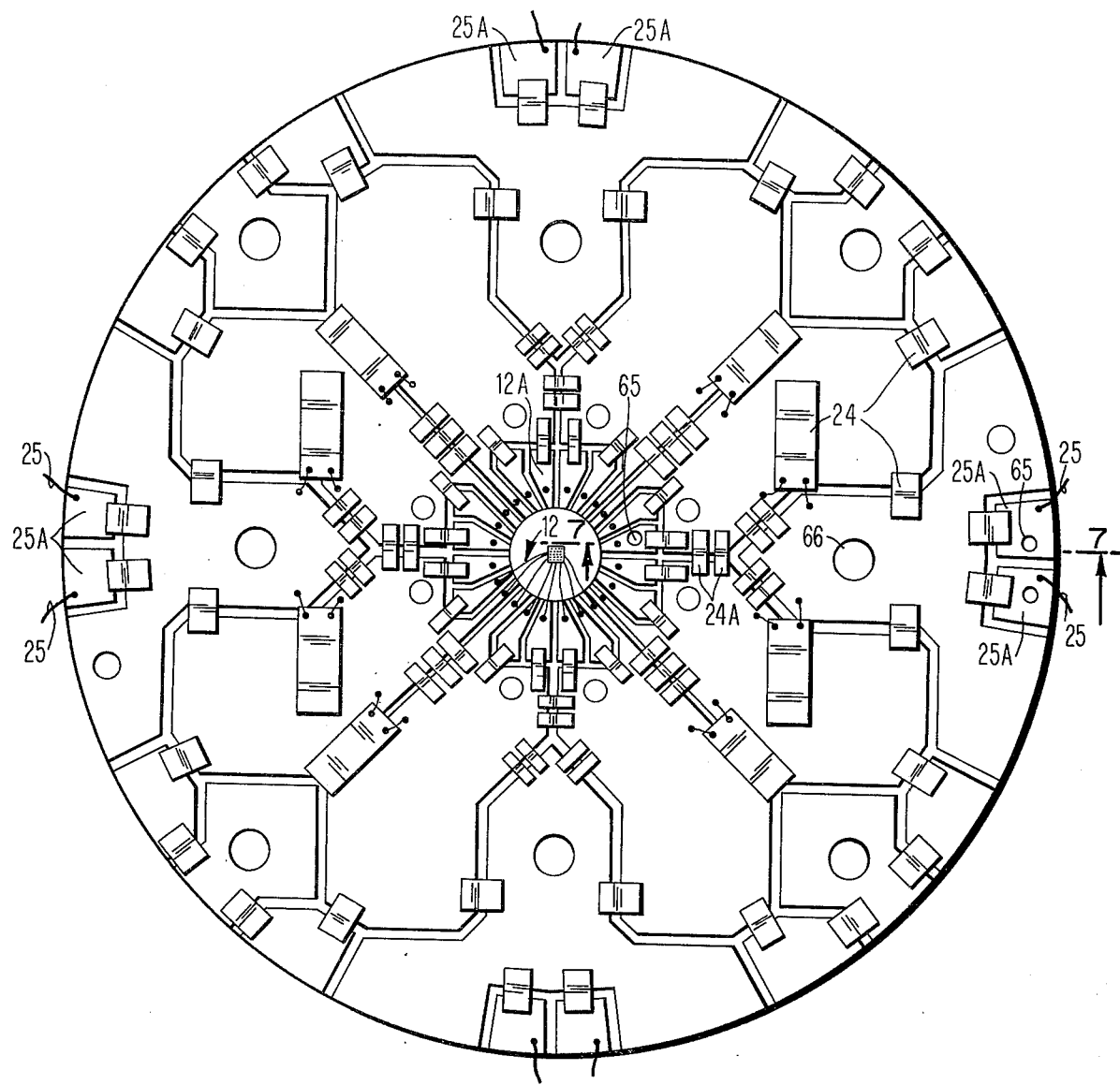
FIG. 6 discloses a top view of the power board 9 of the space transformer structure 2 of the Programmable Interface Contactor Structures of FIGS. 1 and 2.
Figure 7:
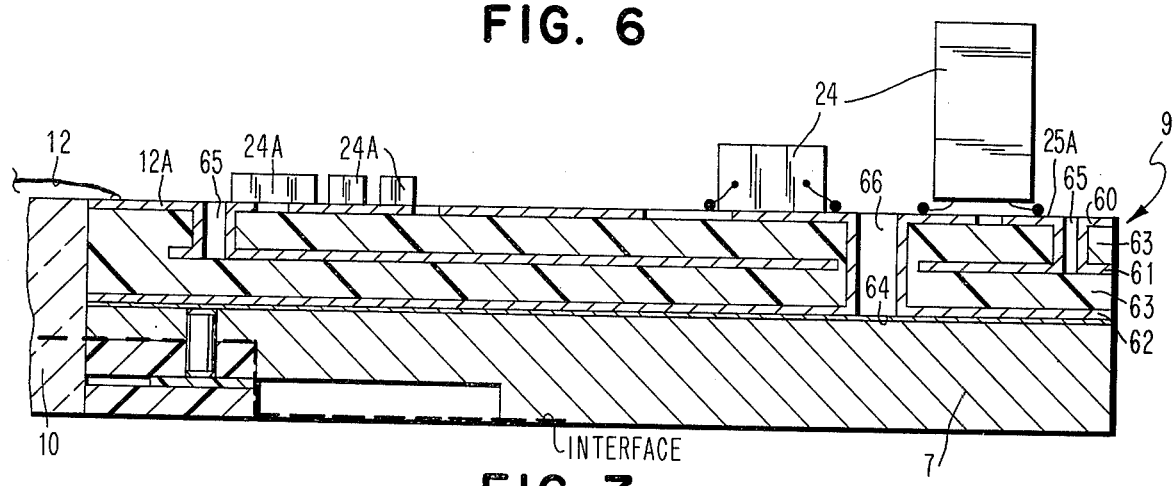
FIG. 7 discloses a cross sectional view of a portion of the power board of FIG. 6.

Referring to FIGS. 6 and 7 a preferred embodiment of typical though illustrative only, printed circuit board is shown in detail.

FIG. 6 discloses a top view of the power board 9 on which are soldered many chip capacitors 24A and small tantalum capacitors 24. These capacitors assist in providing low inductance paths for each of the 24 power leads 12. Sixteen lands radiate from the center termination lands 12A via internal lands. Plated through vias 65 connect the top surface lands 12A and 25A to the internal lands.

FIG. 7 discloses a cross sectional view of a portion of the power board 9. The board is comprised of copper lands 60, 61 and 62, separated by epoxy glass layers 63. The vias 65 can be seen as connecting certain of the top lands 60 to certain of the internal lands 61. Other vias like the plated through screw hole 66 connect certain of the top lands 60 to the bottom land 62 which is "tester ground". This allows certain of the top lands 60 to be tester ground and thus enable decoupling capacitors to be used between powering lands and tester ground. A thin insulating layer 64 is used between the power board and mounting plate 7 to isolate chassis ground from tester ground.

Although a complete electronic test system for testing semiconductor devices having high circuit density is not disclosed herein in detail, such systems are well known in the art. The practice of applicants' invention is not limited to the architecture of any particular electronic test system for testing electronic devices. A test system employing a computer system, a tester, and a Programmable Interface Contactor Structure as disclosed herein is in accordance with the invention and maybe used to practice the invention.

An electronic test system generally of the type disclosed in U.S. Pat. No. 3,916,306 granted Oct. 28, 1975 to Michael J. Patti, entitled "Method and Apparatus for Testing High Circuit Density Devices" and of common assignee herewith, or generally of the type disclosed in U.S. Pat. No. 3,873,878, granted March 25, 1975 to John D. Barnard, entitled "Electronic Tester for Testing Devices Having Circuit Density," of common assignee herewith, maybe employed to practice applicants' invention.

Referring to U.S. Pat. No. 3,806,800 of common assignee herewith, the electronic test system maybe generally of the type disclosed therein.

SUMMARY

Referring to the drawings and preceding description of the preferred embodiment of the invention the following statements have full antecedent and will be fully understood and appreciated by persons skilled in the art.

1. In the Programmable Interface Contactor Structure, the I/O electrical paths from the part number board to the device, or product, under test are very short in length. In the preferred embodiment, the path length is less than 2 inches. These short paths are effective in maintaining the appropriate electrical environment (namely low impedance, minimum cross talk, minimum noise introduction and minimum delay in signal transmission), in connecting a tester to high speed solid state circuitry under test.

2. The power board provides efficient means for providing low resistance power supply paths with very ample provisions for the decoupling thereof in close proximity to the device, or product under test.

3. The structure and assembly thereof allows assignment of any probe to provide power or ground to the device, or product under test.

4. The Programmable Interface Contactor Structure may be employed in the testing of chips, wafers, chip sites on packaging structures, and with obvious modification various other structures known in the art, such as module sockets.

5. In a test system the probe assembly and the space transformer structure are suitably mounted on a product handler and aligned to assure accurate probing of the product under test. The part number board corresponding to the product under test is secured and aligned to the top of the space transformer structure by any suitable means, such as machine screws. Each product part number may require a different and unique part number board. In an actual test environment the part number board maybe changed in less than one minute.

6. As is well known, the probes of the probe assembly through wear, electrical deterioration, or abuse may require replacement. It is apparent that the probe assembly is readily replaceable.

7. The power distribution accomplished by the Programmable Interface Contactor provides the following advantages, numerous low resistance electrical paths available, capability for a variety of decoupling circuitry, and design flexibility for power pad assignment.

8. In the preferred embodiment the probe array is 11 × 11, with one deleted. Thus there are 120 discrete probes 31 in the probe assembly. Twenty-four of the probes are connected via power leads 12 to lands 12A on the power board 9. Ninety-six of the probes are connected via I/O leads 11 to pogo connectors 13, 14 on plate 6. It will be appreciated that the invention is not to be limited to this total number of probes, nor to this ratio of power probes to I/O probes.

While the invention has been described and shown particularly with reference to one of its preferred embodiments it will be understood by those skilled in the art to which the work is directed that various changes in form and detail maybe made without departing from either the spirit or scope of the invention.

What is claimed is:

1. A Programmable Interface Contactor Structure used in a test system for testing semiconductor devices having high circuit density and where said devices each include a substantially planar surface having an array of conductive pads disposed thereon, said Programmable Interface Contactor Structure comprising:

a part number printed circuit board having first and second planar surfaces, a plurality of electrical connectors extending from said first surface of said part number printed circuit board, a first orderly array of discrete conductive surfaces disposed upon said second planar surface of said part number printed circuit board, electrically conductive means connecting each of said discrete conductive surfaces to a predetermined one of said plurality of electrical connectors;

a space transformer structure having a first planar member and a second planar member in parallel spaced relationship to said first planar member, said second planar member having an inwardly disposed and an outwardly disposed surface, a plurality of electrical contacts contained within and extending through said first planar member and providing a second orderly array of discrete conductive areas respectively in physical contact with the conductive surfaces of said first orderly array of discrete conductive surfaces, a densely spaced pattern of conductive lands contained on said outwardly disposed surface of said second planar member, circuit means electrically connecting predetermined ones of said densely spaced conductive lands to predetermined ones of said electrical contacts contained within said first planar members; and probe assembly means having a plurality of discrete electrical probes for connecting each of said densely spaced conductive lands to predetermined ones of said array of conductive pads disposed on said substantially planar surface of said device under test.

2. A Programmable Interface Contactor Structure as claimed in claim 1 wherein said second planar member of said space transformer includes a printed circuit board having a plurality of discrete electrically conductive paths thereon, each of said paths having predetermined electrical characteristics, and where said circuit means recited in claim 1 contains means for connecting each of said conductive paths to predetermined ones of said densely spaced conductive lands.

3. A Programmable Interface Contactor Structure as claimed in claim 2 wherein said probe assembly comprises a plurality of probes, each probe formed with a length many times its cross sectional largest dimension whereby the probes buckle or deflect when a predetermined axial load is applied thereto.

4. A Programmable Interface Contactor Structure as claimed in claim 2 and wherein said circuit means includes a space transformer die centrally disposed within said second planar member of said space transformer and extending from said inwardly disposed surface to said outwardly disposed surface of said second planar member, said space transformer die's outwardly disposed surface being substantially planar and having disposed therein said densely spaced conductive lands, said transformer die comprising a plurality closely spaced electrical conductors contained within, and separated one from the another by dielectric material, each of said conductors of said space transformer die electrically connecting one of said densely spaced conductive lands to said circuit means.

5. In a high speed electronic test system, a Programmable Interface Contactor Structure as recited in claim 4, wherein I/O signals are conveyed to said device under test via said part number printed circuit board, and said discrete electrical paths of said printed circuit board of said space transformer are utilized to provide power supply potentials to said device under test.

6. A Programmable Interface Contactor Structure used in a test system for testing semiconductor devices having high circuit density and where said devices each include a substantially planar surface having an array of conductive pads disposed thereon, said Programmable Interface Contactor Structure comprising:

a part number printed circuit board having first and second planar surfaces, a plurality of electrical connectors extending from said first surface of said part number printed circuit board, connection means for connecting said electrical connectors to said test system, a first orderly array of discrete conductive surfaces disposed upon said second planar surface of said part number printed circuit board, electrically conductive means connecting each of said discrete conductive surfaces to a predetermined one of said plurality of electrical connectors;

a space transformer structure having a first planar member and a second planar member in parallel spaced relationship to said first planar member, said second planar member having an inwardly disposed and an outwardly disposed surface, a plurality of electrical contacts contained within and extending through said first planar member and providing a second orderly array of discrete conductive areas respectively in physical contact with the conductive surfaces of said first orderly array of discrete conductive surfaces, a densely spaced pattern of conductive lands contained on said outwardly disposed surface of said second planar member, first circuit means electrically connecting predetermined ones of said densely spaced conductive lands to predetermined ones of said electrical contacts contained within said first planar member; and second circuit means for connecting each of said densely spaced conductive lands to predetermined ones of said array of conductive pads disposed on said substantially planar surface of said device under test.

7. A Programmable Interface Contactor Structure as claimed in claim 6 wherein said second planar member of said space transformer includes a multilayered printed circuit board having a plurality of discrete electrically conductive paths thereon, each of said paths having predetermined electrical characteristics, and where said first circuit means recited in claim 6 contains means for connecting each of said conductive paths of said printed circuit board to a predetermined one of said densely spaced conductive lands.

8. A Programmable Interface Contactor Structure as claimed in claim 7 wherein said second circuit means comprises a plurality of probes, each probe formed with a length many times its cross sectional largest dimension whereby the probes buckle or deflect when a predetermined axial load is applied thereto.

9. A Programmable Interface Contactor Structure as claimed in claim 8 and wherein said first circuit means includes a space transformer die centrally disposed within said second planar member of said space transformer and extending from said inwardly disposed surface to said outwardly disposed surface of said second planar member, said space transformer die's outwardly disposed surface being substantially planar and having disposed therein said densely spaced conductive lands, said transformer die comprising a plurality closely spaced electrical conductors contained within, and separated one from another by dielectric material, each of said conductors of said space transformer die electrically connecting one of said densely spaced conductive lands to said circuit means.

10. In a high speed electronic test system for testing micro-miniature devices and structures, said test system employing a tester interconnected with a computer system and operative under control of a test program, a contactor structure for contacting a device under test, said contactor structure being at least electrically connected to said tester, said contactor structure comprising:

a part number printed circuit having an upper and lower substantially planar surface, connection means supported on said upper planar surface of said part number printed circuit board, a plurality of discrete electrical contacts arranged in a first spaced array and contained on said lower planar surface of said part number printed circuit board, said part number printed circuit board containing electrically conductive means for electrically connecting said discrete electrical contacts to said connection means;

a space transformer structure having a first substantially planar member and a second substantially planar member, structural means for maintaining said first and second planar members of said space transformer in parallel space relationship, said first planar member of said space transformer structure containing a second spaced array of electrical contacts;

said first and second spaced array of electrical contacts being substantially identical in spacing, whereby an electrical interface between said part number printed circuit board and said space transformer structure is provided;

said second planar member of said transformer including a printed circuit power board having a plurality of discrete electrical paths;

said second planar member of said space transformer structure including an outwardly exposed array of electrical contacts arranged in a third spaced array, where the spacing between said contacts of said third array is very close as compared to the spacing between said contacts in said second array, first circuit means for connecting each of said contacts of said second array, and each of said conductive paths of said power printed circuit board with said third array of contacts;

second circuit means for connecting said third array of electrical contacts with a device under test, said second means further providing an electrical interface between said space transformer structure and said first means.

* * * * *

UNITED STATES PATENT AND TRADEMARK OFFICE
CERTIFICATE OF CORRECTION

PATENT NO. : 3,963,986
DATED : June 15, 1976
INVENTOR(S) : ROBERT M. MORTON ET AL It is certified that error appears in the above-identified patent and that said Letters Patent is hereby corrected as shown below:

In figure 3 of drawing, Change the legend "POGO ASSEMBLY" to --"POGO" ASSEMBLY (Registered Trademark Pylon Company, Inc.)--.

Column 7, line 67, Change "pogo" to --"POGO" (Registered Trademark Pylon Company, Inc., Massachusetts Corporation, 51 Newcomb St., Attleboro, Mass. 02703)--.

UNITED STATES PATENT AND TRADEMARK OFFICE
CERTIFICATE OF CORRECTION

PATENT NO. : 3,963,986  Page 2 of 2
DATED : June 15, 1976
INVENTOR(S) : ROBERT M. MORTON ET AL It is certified that error appears in the above-identified patent and that said Letters Patent is hereby corrected as shown below:

```
Column 9,  line 4       Change "pogo" to --"POGO"--.
Column 9,  line 53      Change "pogo" to --"POGO"--.
Column 9,  line 65      Change "pogo" to --"POGO"--.
Column 9,  line 66      Change "pogo" to --"POGO"--.
Column 9,  line 68      Change "pogo" to --"POGO"--.
Column 10, line 3       Change "pogo" to --"POGO"--.
Column 10, line 6       Change "pogo" to --"POGO"--.
Column 11, line 16      Change "pogo" to --"POGO"--.
Column 13, line 55      Change "pogo" to --"POGO"--.
```

Signed and Sealed this

Second Day of April 1985

[SEAL]

Attest:

DONALD J. QUIGG

Attesting Officer    Acting Commissioner of Patents and Trademarks